US011015098B2

(12) United States Patent
Takahashi et al.

(10) Patent No.: US 11,015,098 B2
(45) Date of Patent: May 25, 2021

(54) POLISHING COMPOSITION

(71) Applicant: FUJIMI INCORPORATED, Kiyosu (JP)

(72) Inventors: Shuhei Takahashi, Kiyosu (JP); Masatoshi Tomatsu, Kiyosu (JP)

(73) Assignee: FUJIMI INCORPORATED

(*) Notice: Subject to any disclaimer, the term of this patent is extended or adjusted under 35 U.S.C. 154(b) by 0 days.

(21) Appl. No.: 15/524,989

(22) PCT Filed: Oct. 30, 2015

(86) PCT No.: PCT/JP2015/080844
§ 371 (c)(1),
(2) Date: May 5, 2017

(87) PCT Pub. No.: WO2016/072371
PCT Pub. Date: May 12, 2016

(65) Prior Publication Data
US 2017/0321098 A1  Nov. 9, 2017

(30) Foreign Application Priority Data

Nov. 7, 2014 (JP) ............................. JP2014-227388
Jun. 29, 2015 (JP) ................................ 2015-130440

(51) Int. Cl.
| C09K 3/14 | (2006.01) |
| C09G 1/02 | (2006.01) |
| H01L 21/02 | (2006.01) |
| B24B 37/04 | (2012.01) |
| H01L 21/304 | (2006.01) |
| B24B 1/00 | (2006.01) |
| H01L 29/16 | (2006.01) |

(52) U.S. Cl.
CPC .............. *C09K 3/1409* (2013.01); *B24B 1/00* (2013.01); *B24B 37/042* (2013.01); *B24B 37/044* (2013.01); *C09G 1/02* (2013.01); *C09K 3/1463* (2013.01); *H01L 21/02024* (2013.01); *H01L 21/304* (2013.01); *H01L 29/1608* (2013.01)

(58) Field of Classification Search
CPC ...... C09K 3/1409; C09K 3/1463; B24B 1/00; B24B 37/042; B24B 37/044; C09G 1/02; H01L 21/02024; H01L 21/304; H01L 29/1608
See application file for complete search history.

(56) References Cited

U.S. PATENT DOCUMENTS

| 5,916,453 | A | 6/1999 | Beilin et al. | |
| 2004/0132305 | A1* | 7/2004 | Nishimoto | C09G 1/02 438/690 |
| 2004/0152309 | A1* | 8/2004 | Carter | C03C 19/00 438/689 |
| 2004/0221799 | A1 | 11/2004 | Nakayama et al. | |
| 2004/0235396 | A1 | 11/2004 | Hattori et al. | |
| 2005/0159005 | A1* | 7/2005 | Shirasu | H01L 21/02065 438/692 |
| 2006/0040593 | A1 | 2/2006 | Ikenaka et al. | |
| 2006/0236922 | A1 | 10/2006 | Ishibashi et al. | |
| 2006/0292728 | A1 | 12/2006 | Ishibashi et al. | |
| 2007/0021040 | A1* | 1/2007 | Kawata | C09G 1/02 451/41 |
| 2007/0149097 | A1 | 6/2007 | Fujii et al. | |
| 2008/0153292 | A1* | 6/2008 | White | C09G 1/02 438/692 |
| 2008/0271667 | A1 | 11/2008 | Ishibashi et al. | |
| 2008/0272392 | A1 | 11/2008 | Ishibashi et al. | |
| 2009/0318063 | A1* | 12/2009 | Misra | B24B 37/042 451/28 |
| 2010/0123168 | A1 | 5/2010 | Ishibashi et al. | |
| 2010/0200865 | A1 | 8/2010 | Fujito et al. | |
| 2010/0227532 | A1 | 9/2010 | Ishibashi et al. | |
| 2011/0012233 | A1 | 1/2011 | Ishibashi et al. | |
| 2012/0223417 | A1 | 9/2012 | Ishibashi et al. | |
| 2012/0240478 | A1 | 9/2012 | Horiuchi et al. | |
| 2012/0240479 | A1* | 9/2012 | Doi | B24B 37/044 51/309 |
| 2012/0267606 | A1 | 10/2012 | Ishibashi et al. | |

(Continued)

FOREIGN PATENT DOCUMENTS

| CN | 102484181 | 5/2012 |
| CN | 102484181 A | 5/2012 |

(Continued)

OTHER PUBLICATIONS

Extended European Search Report for European Patent Application No. 158580373.3 dated Aug. 1, 2018.
Office Action for Chinese Patent Application No. 201580060437.7 dated Jun. 19, 2018.
Office Action for Japanese Patent Application No. 2015-130439 dated Nov. 15, 2018.
First Office Action in EP Patent Application No. 15 856 847.7 dated Jun. 17, 2020.
First Office Action in EP Patent Application No. 17 001 211.6 dated Jun. 17, 2020.
3rd Office Action in JP Patent Application No. 2015-130439 dated Nov. 14, 2019.

(Continued)

*Primary Examiner* — Pegah Parvini
*Assistant Examiner* — Ross J Christie
(74) *Attorney, Agent, or Firm* — Katten Muchin Rosenman LLP

(57) ABSTRACT

The present invention provides a polishing composition for use in polishing a material having a Vickers hardness of 1500 Hv or higher. The polishing composition has an oxidation-reduction potential $ORP_x$ mV and the material to be polishing has an oxidation-reduction potential $ORP_y$ mV, with their relation satisfying $ORP_x - ORP_y \geq 100$ mV.

17 Claims, No Drawings

(56) References Cited

U.S. PATENT DOCUMENTS

| | | | |
|---|---|---|---|
| 2013/0029489 A1* | 1/2013 | Suzuki | B24B 37/044 438/693 |
| 2013/0237128 A1 | 9/2013 | David et al. | |
| 2013/0256700 A1* | 10/2013 | Ishibashi | H01L 29/32 257/77 |
| 2013/0260558 A1 | 10/2013 | Oota et al. | |
| 2013/0292802 A1 | 11/2013 | Ishibashi et al. | |
| 2014/0057438 A1* | 2/2014 | Yoshida | H01L 21/02024 438/692 |
| 2014/0094032 A1 | 4/2014 | Yoshida et al. | |
| 2014/0124826 A1 | 5/2014 | Ishibashi et al. | |
| 2014/0242750 A1 | 8/2014 | Sato et al. | |
| 2014/0248776 A1* | 9/2014 | Asano | C09G 1/02 438/693 |
| 2014/0291811 A1 | 10/2014 | Ishibashi et al. | |
| 2014/0349112 A1 | 11/2014 | Ishibashi et al. | |
| 2015/0202700 A1 | 7/2015 | Konodo et al. | |
| 2015/0354058 A1* | 12/2015 | Morinaga | C23C 4/18 428/141 |
| 2016/0257854 A1* | 9/2016 | Omori | B24B 37/00 |
| 2017/0115239 A1 | 4/2017 | Ishibashi et al. | |
| 2017/0283988 A1 | 10/2017 | Ishibashi et al. | |

FOREIGN PATENT DOCUMENTS

| | | |
|---|---|---|
| CN | 103890127 A | 6/2014 |
| EP | 2477237 A1 | 7/2012 |
| EP | 2 511 358 A1 | 10/2012 |
| JP | H07-288243 A | 10/1995 |
| JP | H09-262757 A | 10/1997 |
| JP | 11188610 A | 7/1999 |
| JP | H11188610 | 7/1999 |
| JP | 11294460 A | 10/1999 |
| JP | 11303876 A | 11/1999 |
| JP | 2004356609 A | 12/2004 |
| JP | 2006-93666 A | 4/2006 |
| JP | 2006179647 A | 7/2006 |
| JP | 2006310362 A | 11/2006 |
| JP | 2006332437 A | 12/2006 |
| JP | 2007-21703 A | 2/2007 |
| JP | 2007-311586 A | 11/2007 |
| JP | 2007-533141 A | 11/2007 |
| JP | 2008-068390 A | 3/2008 |
| JP | 2010023199 A | 2/2010 |
| JP | 2010182782 A | 8/2010 |
| JP | 2011-513991 A | 4/2011 |
| JP | 2011-121153 A | 6/2011 |
| JP | 2011165909 A | 8/2011 |
| JP | 2012-248569 A | 12/2012 |
| JP | 2013120885 A | 6/2013 |
| JP | 2014-024154 A | 2/2014 |
| TW | 201247730 A | 12/2012 |
| WO | 2005/099388 A2 | 10/2005 |
| WO | 2009/111001 A2 | 9/2009 |
| WO | 2011/070898 A1 | 6/2011 |
| WO | 2012/147605 A1 | 11/2012 |
| WO | 2013035539 | 3/2013 |
| WO | 2013/150822 A1 | 10/2013 |
| WO | 2014112218 A1 | 11/2013 |
| WO | 2015/059987 A1 | 4/2015 |

OTHER PUBLICATIONS

Written Opinion of ISA for International Appl PCT/JP2015/080843 dated Jan. 19, 2016.
1st Office Action for CN Patent Application No. 201580060434.3 dated Aug. 14, 2018.
Non Final Office Action for U.S. Appl. No. 15/525,017 dated Feb. 16, 2018.
Final Office Action for U.S. Appl. No. 15/525,017 dated Jul. 6, 2018.
Non-Final Office Action for U.S. Appl. No. 16/254,930 dated Sep. 18, 2019.
Final Office Action in U.S. Appl. No. 16/254,930 dated Feb. 18, 2020.
3rd Office Action for CN Patent Application 201580060434.3 dated Mar. 3, 2020.
Decision to Grant a Patent for JP Patent Application No. 2015-130439.
Concise Locksmith Manual, pp. 464-467.
Decision of Rejection for CN 201580060437.7 dated Apr. 15, 2020.
2nd Office Action for Chinese Patent Application No. 201580060434.3 dated Jun. 5, 2019.
Xiandai,Current Process Technique Experiments, Beihang University Press, 2014, pp. 66-67.
1st Office Action for Japanese Patent Application No. 2015-215119 dated Aug. 1, 2019.
Decision of Refusal in Japanese Patent Application No. 2015-130440 dated Aug. 1, 2019.
3rd Office Action in CN Application No. 201580060437.7, dated Sep. 23, 2019.
1st Office Action in U.S. Appl. No. 16/254,930, dated Sep. 18, 2019.
First Office Action in TW Patent Application No. 104136498 dated Jan. 13, 2020.
First Office Action in TW Patent Application No. 104136497 dated Jan. 13, 2020.
Second Office Action in TW Patent Application No. 104136498 dated Nov. 26, 2020.
Extended Search Report for EP Application No. 20202592.0 dated Feb. 8, 2021.
Office Action for EP Application No. 17001211.6, dated Feb. 18, 2021.
Office Action in EP Patent Application No. 15 856 847.7, dated Mar. 15, 2021.

* cited by examiner

POLISHING COMPOSITION

TECHNICAL FIELD

The present invention relates to a polishing composition. In particular, it relates to a polishing composition used in polishing a super-hard material such as single crystal silicon carbide.

The present application claims priority to Japanese Patent Application Nos. 2014-227388 filed on Nov. 7, 2014 and 2015-130440 filed on Jun. 29, 2015; and the entire contents thereof are incorporated herein by reference.

BACKGROUND ART

With respect to super-hard materials such as diamond, sapphire (aluminum oxide), silicon carbide, boron carbide, tungsten carbide, silicon nitride and titanium nitride, surfaces are typically subjected to polishing (lapping) processes in which diamond abrasives are supplied to platens for polishing. However, in a lapping process using a diamond abrasive, defects and deformation are likely to occur due to formation of scratches and leftover scratches. Thus, studies are underway for a polishing process that is carried out after or instead of diamond lapping, using a polishing pad and polishing slurry supplied to the interface between the polishing pad and an object to be polished. Publications disclosing this type of conventional art include Patent Documents 1 to 3.

CITATION LIST

Patent Literature

[Patent Document 1] Japanese Patent Application Publication No. 2011-121153
[Patent Document 2] Japanese Patent Application Publication No. 2012-248569
[Patent Document 3] Japanese Patent Application Publication No. 2014-24154

SUMMARY OF INVENTION

Technical Problem

The conventional art documents suggest the use of certain components (abrasives, oxidants, etc.) in their slurries used for polishing (in their polishing compositions) so as to improve polishing removal rates (amounts of surfaces removed from objects to be polished per unit time) and surface smoothness. However, even these techniques tall short of satisfying levels of polishing removal rates required for practical applications.

The present invention has been made under these circumstances with a primary objective to provide a polishing composition capable of effectively increasing polishing removal rates in polishing of the super-hard material. Another related objective is to provide a method for producing an object to be polished using the polishing composition.

Solution to Problem

The present invention provides a polishing composition for polishing a material having a Vickers hardness of 1500 Hv or higher. The polishing composition has an oxidation-reduction potential $ORP_x$ (mV) and the material to be polished has an oxidation-reduction potential $ORP_y$ (mV), and their relation satisfies the formula (1) below:

$$ORP_x - ORP_y \geq 100 \text{mV} \quad (1)$$

The polishing removal rate can be significantly increased with the use of such a polishing composition that has an oxidation-reduction potential higher by 100 mV or more than the material to be polished.

In a preferable embodiment of the polishing composition disclosed herein, the polishing composition comprises an abrasive and a polishing aid. The relation of the abrasive content W (% by weight) and the polishing aid content C (% by weight) in the polishing composition satisfies the formula (2) below:

$$W/C \geq 1.5 \quad (2)$$

According to this polishing composition, the polishing removal rate-increasing effect can be more favorably obtained.

In a preferable embodiment of the polishing composition disclosed herein, the polishing composition comprises an abrasive. The relation of the abrasive content W (% by weight) in the polishing composition, the oxidation-reduction potential $ORP_x$ (mV) of the polishing composition and the oxidation-reduction potential $ORP_y$ (mV) of the material to be polished satisfies the formula (3) below:

$$(ORP_x - ORP_y) \times W \geq 1000 \quad (3)$$

According to this polishing composition, the polishing removal rate-increasing effect can be more favorably obtained.

In a preferable embodiment of the polishing composition disclosed herein, the abrasive content W is 4% to 10% by weight. When the abrasive content is in this range, a higher polishing removal rate can be obtained.

The art disclosed herein can be preferably implemented in an embodiment where the polishing composition has an oxidation-reduction potential $ORP_x$ in a range of 750 mV to 1500 mV and the material to be polished has an oxidation-reduction potential $ORP_y$ in a range of 500 mV to 700 mV When $ORP_x$ and $ORP_y$ are in the respective ranges, the polishing removal rate-increasing effect can be more favorably exhibited.

In a preferable embodiment of the polishing composition disclosed herein, it has a pH in a range of 8 to 11. In the polishing composition having a pH in this range, the effects of this invention can be favorably produced.

The present invention also provides a method for producing a polished object. The production method comprises polishing an object formed of a material having a Vickers hardness of 1500 Hv or higher with a polishing composition disclosed herein supplied to the object. The production method can efficiently provide a polished object having a polished surface of a super-hard material.

DESCRIPTION OF EMBODIMENTS

Preferred embodiments of the present invention are described below. Matters necessary to practice this invention other than those specifically referred to in this description may be understood as design matters based on the conventional art in the pertinent field for a person of ordinary skill in the art. The present invention can be practiced based on the con tents disclosed in this description and common technical knowledge in the subject field.

<Objects to be Polished>

The polishing composition disclosed herein is used for polishing a material (a super-hard material) having a Vickers hardness of 1500 Hv or higher. The Vickers hardness of the material to be polished is preferably 1800 Hv or higher (e.g. 2000 Hv or higher, typically 2200 Hv or higher). The maximum Vickers hardness is not particularly limited. It can be about 7000 Hv or lower (e.g. 5000 Hv or lower, typically 3000 Hv or lower). In the present description, Vickers hardness can be determined based on JIS R 1610-2003 to which international standard ISO 14705-2000 corresponds.

Examples of the material having a Vickers hardness of 1500 Hv or higher include diamond, sapphire (aluminum oxide), silicon carbide, boron carbide, tungsten carbide, silicon nitride and titanium nitride. The polishing method disclosed herein can be preferably applied to a single crystal surface of the mechanically- and chemically-stable material. In particular, the polished surface is preferably formed of silicon carbide. Silicon carbide is expected to be a material for semiconductor substrates with little power loss, excellent heat resistance, etc. Thus, it is particularly advantageous for practical use to improve the surface conditions. The polishing composition disclosed herein is particularly preferably applied to a single crystal silicon carbide surface.

The oxidation-reduction potential $ORP_y$ vs. standard hydrogen electrode of the material to be polished is not particularly limited as long as it satisfies the formula (1) described later in relation to the oxidation reduction potential $ORP_x$ of the polishing composition. The art disclosed herein can be preferably applied to a material with $ORP_y$ of about 500 mV to 700 mV (e.g. about 600 mV to 700 mV). In this description, as the oxidation-reduction potential $ORP_y$ of the material to be polished, the value determined as follows is used: the material in a powder form is dispersed in water to prepare a slurry; the slurry is adjusted with a pH adjusting agent (e.g. potassium hydroxide (KOH)) to the same pH as the polishing composition described later; the oxidation-reduction potential of the slurry is measured, using a commercial oxidation-reduction potentiometer. The oxidation-reduction potentials of the polishing composition and the material to be polished referred to herein indicate the oxidation-reduction potential values versus standard hydrogen electrode that are determined at a liquid temperature of 25° C.

<Polishing Composition>
(Oxidation Reduction Potential $ORP_x$)

The polishing composition disclosed herein has an oxidation-reduction potential $ORP_x$ higher by 100 mV or more (by at least 100 mV) than the oxidation-reduction potential $ORP_y$ (mV) of the material to be polished (the material forming the surface of the object to be polished). That is, the relation of $ORP_x$ (mV) and $ORP_y$ (mV) satisfies the formula (1) below:

$$ORP_x - ORP_y \geq 100 \text{mV} \quad (1)$$

With the use of the polishing composition whose oxidation-reduction potential is higher by 100 mV or more than the material to be polished, the polishing removal rate increases, whereby the material with Vickers hardness at or above 1500 Hv can be efficiently polished.

$ORP_x$ may be higher than $ORP_y$ by 100 mV or more. From the standpoint of the polishing efficiency etc., it is preferably higher by 200 mV or more (e.g. 300 mV or more). From the standpoint of the likelihood of obtaining a higher-quality surface, the value of $ORP_x$ minus $ORP_y$ ($ORP_x - ORP_y$) is preferably 1000 mV or less, more preferably 800 mV or less, or yet more preferably 500 mV or less. For instance, with the value of $ORP_x - ORP_y$ being 100 mV or more and 500 mV or less, higher levels of polishing efficiency and smoothness of the polished surface can be achieved at the same time.

$ORP_x$ is not particularly limited as long as it satisfies the formula (1) in relation to $ORP_y$. From the standpoint of the polishing efficiency, etc., it is preferably 750 mV or higher, or more preferably 800 m V or higher (e.g. 900 mV or higher). The upper limit of $ORP_x$ is not particularly limited. From the standpoint of the likelihood of obtaining a higher-quality surface, it is preferably 1500 mV or lower, more preferably 1200 mV or lower, or yet more preferably 1000 mV or lower.

The $ORP_x$ value can be adjusted, for instance, by changing the species of abrasive and/or polishing aid (e.g. agent that acts to oxidize the surface of the object during polishing) in the polishing composition or by changing the ratio of the abrasive to the polishing aid. In other words, by suitably selecting the species of abrasive and polishing aid and their ratio, $ORP_x$ can be adjusted to the suitable range while satisfying the suitable relation. As the method for adjusting $ORP_x$ to the suitable range while satisfying the suitable relation, a method such as changing the pH of the composition can be used. For controlling the $ORP_x$ value, solely one method or a combination of two or more methods can be used.

(Abrasive)

The polishing composition disclosed herein typically includes an abrasive. The material and the properties of the abrasive are not particularly limited as long as the polishing composition satisfies the formula (1) with respect to the oxidation-reduction potential in relation to the material to be polished. For instance, the abrasive may be inorganic particles, organic particles, or inorganic/organic composite particles. Examples include an abrasive substantially formed of any of the following: oxide particles such as silica particles, alumina particles, cerium oxide particles, chromium oxide particles, titanium dioxide particles, zirconium oxide particles, magnesium oxide particles, manganese dioxide particles, zinc oxide particles, and iron oxide particles; nitride particles such as silicon nitride particles and boron nitride particles; carbide particles such as silicon carbide particles and boron carbide particles; diamond particles; and carbonates such as calcium carbonate and barium, carbonate. For the abrasive, solely one species or a combination of two or more species can be used. In particular, oxide particles are preferable, such as silica particles, alumina particles, cerium oxide particles, chromium oxide particles, zirconium oxide particles, manganese dioxide particles, and iron oxide particles, because they can efficiently form good surfaces. Among them, alumina particles, zirconium oxide particles, chromium oxide particles and iron oxide particles are more preferable; and alumina particles are particularly preferable.

As used herein, with respect to the composition of an abrasive, "substantially consisting of X" or being "substantially formed of X" means that the ratio of X in the abrasive (or the purity of X) is 90% or higher (preferably 95% or higher, more preferably 97% or higher, or yet more preferably 98% or higher, e.g. 99% or higher) by weight.

When alumina particles are used as the abrasive, in general, the higher the alumina particle content is in the total abrasive in the polishing composition, the more advantageous it may be. For instance, the alumina particle content in the total abrasive in the polishing composition is preferably 70% by weight or higher, more preferably 90% by weight or higher, yet more preferably 95% by weight or higher (e.g. 95% to 100% by weight).

The polishing composition disclosed herein is preferably substantially free of diamond particles as the abrasive. Because of the super hardness, diamond particles ran be a limiting factor in increasing the flatness. In addition, diamond particles are generally expensive and thus may not be considered advantageous in terms of cost performance. In practical aspects, it is desirable to be less dependent on expensive materials such as diamond particles.

From the standpoint of the polishing efficiency, etc., the abrasive's Vickers hardness is preferably 800 Hv or higher, more preferably 1200 Hv or higher, or yet more preferably 1500 Hv or higher. The maximum Vickers hardness of the abrasive is not particularly limited. From the standpoint of combining polishing efficiency and smoothness of the polished surface, it is preferably 3000 Hv or lower, more preferably 2000 Hv or lower, or yet more preferably 1700 Hv or lower. In the present description, for the Vickers hardness of an abrasive, the value determined based on JIS R 1610-2003 with respect to the material used as the abrasive is used.

The abrasive's Vickers hardness is preferably equal to or lower than the Vickers hardness of the material forming the surface of the object to be polished (i.e. the material subject to polishing). Because the hardness of the abrasive is limited in relation to the hardness of the material to be polished, degradation of smoothness tends to be inhibited. The Vickers hardness of the abrasive is preferably lower than that of the material to be polished by at least 300 Hv (e.g. at least 500 Hv). From the standpoint of increasing the flatness, the difference in Vickers hardness between the abrasive and the material to be polished is preferably 1000 Hv or less (e.g. 800 Hv or less).

The abrasive usually has a mean secondary particle diameter of 20 nm or larger. From the standpoint of increasing the polishing efficiency etc., it is preferably 100 nm or larger, more preferably 200 nm or larger (e.g. 400 nm or larger). The abrasive with such a mean secondary particle diameter can achieve a higher polishing removal rate. From the standpoint of obtaining a sufficient number of particles per unit weight, the maximum mean secondary particle diameter of the abrasive is suitably about 5000 nm or smaller. From the standpoint of combining higher levels of polishing efficiency and smoothness of the polished surface, the mean secondary particle diameter is preferably 3000 nm or smaller, or more preferably 2000 nm or smaller (e.g. 800 nm or smaller).

With respect to the abrasive's mean secondary particle diameter, for particles smaller than 500 nm, it can be determined as the volume mean particle diameter (arithmetic mean diameter by volume, Mv) by dynamic light scattering, using, for instance, model UPA-UT151 available from Nikkiso Co., Ltd.; for particles of 500 nm or larger, it can be determined as the volume mean particle diameter by pore electrical resistance, etc., using model MULTISIZER 3 available from Beckman Coulter Inc.

The abrasive content W of the polishing composition is not particularly limited as long as the polishing composition satisfies the formula (1) with respect of the oxidation-reduction potential in relation to the material to be polished. It is usually suitably 1% by weight or higher, preferably 2% by weight or higher, more preferably higher than 3% by weight, yet more preferably 4% by weight or higher, or particularly preferably 5% by weight or higher. At such an abrasive content W, $ORP_x$ effectively increases, resulting in a larger value of $ORP_x$–$ORP_y$, whereby the polishing removal rate can be efficiently increased. In view of combining high levels of polishing efficiency and smoothness of the polished surface and in view of obtaining good dispersibility the abrasive content W of the polishing composition is usually suitably 50% by weight or lower, preferably 20% by weight or lower, more preferably 10% by weight or lower, or yet more preferably 8% by weight or lower.

(Polishing Aid)

The polishing composition disclosed herein preferably includes a polishing aid. The polishing aid is a component that enhances the effects of polishing, and a water-soluble species is typically used. The polishing aid is thought to contribute to the polishing with the abrasive, by working to alter (typically oxidize) the surface being polished in the polishing and bring about embrittlement of the polished surface, but is not particularly limited to this.

The species of polishing aid is not particularly limited as long as the polishing composition satisfies the formula (1) with respect to the oxidation-reduction potential in relation to the material to be polished. Examples of the polishing aid include peroxides such as hydrogen peroxide; nitric acid compounds such as nitric acid, its salts (iron nitrate, silver nitrate, aluminum nitrate), and its complexes (ceric ammonium nitrate, etc.); persulfuric acid compounds such as persulfuric acids including peroxomonosulfuric acid and peroxodisulfuric acid as well as its salts (ammonium persulfate, potassium persulfate, etc.); chlorine compounds such as chloric acid and its salts, perchloric acid and its salts (potassium perchlorate, etc.); bromine compounds such as bromic acid and its salts (potassium bromate); iodine compounds such as iodic acid and its salts (ammonium iodate), periodic acid and its salts (sodium periodate, potassium periodate, etc.); ferrates including ferric acid and its salts (potassium ferrate, etc.); permanganates including permanganate acid and its salts (sodium permanganate, potassium, permanganate, etc.); chromates including chromic acid and its salts (potassium chromate, potassium dichromate, etc.); vanadates including vanadic acid and its salts (ammonium vanadate, sodium, potassium vanadate); ruthenates including perruthenic acid and its salts; molybdates including molybdic acid and its salts (ammonium molybdate, disodium molybdate, etc.); rhenates including perrhenic acid and its salts; and tungstates including tungstic acid and its salts (disodium tungstate, etc.). These can be used singly as one species or in a combination of two or more species. In particular, permanganic acid or a salt thereof, chromic acid or a salt thereof, and ferric acid or a salt thereof are preferable. Sodium permanganate and potassium permanganate are particularly preferable. The use of these compounds as the polishing aid can effectively increase $ORP_x$, thereby efficiently increasing the polishing removal rate.

In a preferable embodiment, the polishing composition includes a composite metal oxide as the polishing aid. Examples of the composite metal oxide include metal nitrates, ferrates, permanganates, chromates, vanadates, ruthenates, molybdates, rhenates and tungstates. In particular, ferrates, permanganates and chromates are more preferable; permanganates are even more preferable.

In a more preferable embodiment, as the composite metal oxide, a composite metal oxide CMO is used, with the composite metal oxide having a monovalent or divalent metal (but not a transition metal) and a transition metal in the fourth period of the periodic table. The inclusion of such a composite metal oxide CMO as the polishing aid can effectively increase $ORP_x$, resulting in a larger value of $ORP_x$–$ORP_y$, thereby efficiently increasing the polishing removal rate. Favorable examples of the monovalent or divalent metal include Na, K, Mg and Ca. Among them, Na and K are more preferable. Favorable examples of the transition metal in the fourth period of the periodic table include Fe, Mn, Cr, V and Ti. Among them, Fe, Mn and Cr are more preferable, with Mn being yet more preferable.

When the polishing composition disclosed herein includes a composite metal oxide (preferably a composite metal, oxide CMO) as the polishing aid, it may or may not further include other polishing aid besides the composite metal oxide. The art disclosed herein can be preferably practiced in an embodiment substantially free of other polishing aid (e.g. hydrogen peroxide) besides the composite metal oxide (preferably a composite metal oxide CMO) as the polishing aid.

The polishing aid content C of the polishing composition is not particularly limited as long as the polishing composition satisfies the formula (1) with respect to the oxidation-reduction potential in relation to the material to be polished. It is usually suitably 0.1% by weight or higher. From the standpoint of the polishing efficiency etc., the content C is preferably 0.5% by weight or higher, or more preferably 1% by weight or higher. On the other hand, an excessive polishing aid content C tends to impair the polishing removal rate-increasing effect and may also decrease the stability of the composition. From the standpoint of the stability of the polishing composition, etc., the polishing aid content C is usually suitably 10% by weight or lower, preferably 3% by weight or lower, or more preferably 2% by weight or lower.

(Other Components)

As long as the effects of the present invention are not impaired, the polishing composition disclosed herein may further include, as necessary known additives that can be used in polishing compositions (typically polishing compositions for super-hard materials, e.g. polishing (impositions for silicon carbide substrates), such as chelating agent, thickener, dispersing agent, pH-adjusting agent, surfactant, organic acids, organic acid salts, inorganic acid, inorganic acid salts, anti-corrosive, preservative, and antifungal agent. The amounts of the additives contained can be suitably selected in accordance with their purposes and do not characterize the present invention; and therefore, details are omitted.

(Solvent)

The solvent used in the polishing composition is not particularly limited as long as it allows dispersion of the abrasive. As the solvent, ion-exchanged water (deionized water), pure water, ultrapure water, distilled water and the like can be preferably used. The polishing imposition disclosed herein may further include, as necessary, an organic solvent (a lower alcohol, a lower ketone, etc.) that can be uniformly mixed with water. In typical, water preferably accounts for 90% by volume or more of the solvent in the polishing composition; water more preferably accounts for 95% by volume or more (typically 99% to 100% by volume).

In a preferable embodiment of the polishing composition disclosed herein, the relation of the abrasive content W (% by weight) and the polishing aid content C (% by weight) of the polishing composition satisfies the formula (2) below:

$$W/C \geq 1.5 \quad (2)$$

In other words, the ratio (W/C) of the abrasive content to the polishing aid content is preferably 1.5 or higher. The value of W/C is preferably 2 or higher, more preferably 3 or higher, yet more preferably 4 or higher, or particularly preferably 5 or higher. At such an abrasive to polishing aid ratio (W/C), the polishing removal rate-increasing effect can be more favorably obtained. The upper limit of W/C is not particularly limited. From the standpoint of the stability of the polishing composition, etc., it is preferably 20 or lower, more preferably 15 or lower, yet more preferably 10 or lower, or particularly preferably 8 or lower.

In another preferable embodiment, the relation of the abrasive content W (% by weight) in the polishing composition, $ORP_x$ (mV) of the polishing composition, and $ORP_y$ (mV) of the material to be polished satisfies the formula (3) below:

$$(ORP_x - ORP_y) \times W \geq 1000 \quad (3)$$

In other words, the value of $(ORP_x - ORP_y) \times W$ (or shown as "α" hereinafter) is preferably 1000 or greater. For instance, by suitably selecting the species of abrasive and polishing aid and the ratio of their contents to satisfy the relation of the formula (1) while adjusting the abrasive content W to satisfy the relation $\alpha \geq 1000$, the polishing removal rate-increasing effect can be more favorably obtained. From the standpoint of the polishing efficiency etc., the polishing composition preferably satisfies $\alpha \geq 1200$, more preferably $\alpha \geq 1500$, or particularly preferably $\alpha \geq 1800$. The upper limit of a is not particularly limited. From the standpoint of the smoothness of the polished surface, the polishing composition satisfies usually suitably $\alpha \leq 4000$, preferably $\alpha \leq 3500$, or more preferably $\alpha \leq 2500$. For instance, the polishing composition that satisfies $1200 \leq \alpha \leq 2000$ is favorable in view of combining high levels of polishing efficiency and surface smoothness.

The polishing composition is not particularly limited in pH as long as the polishing composition satisfies the formula (1) with respect to the oxidation-reduction potential in relation to the material to be polished. The pH of the polishing composition is usually suitably about 2 to 12. The polishing composition having a pH value in this range is likely to achieve a practical polishing removal rate. From the standpoint of obtaining greater effects of the art disclosed herein, the polishing composition's pH value is preferably 6 to 10, more preferably 8 to 11, or particularly preferably 8.5 to 9.5.

The method for preparing the polishing composition disclosed herein is not particularly limited. For instance, the respective components of the polishing composition may be mixed with a known mixing device such as a propeller stirrer, ultrasonic disperses and homo mixer. The mode of mixing these components is not particularly limited. For instance, all the components can be mixed at once or in a suitably prescribed order.

<Polishing Method>

The polishing composition disclosed herein can be used in polishing of an object in an embodiment comprising, for instance, the following operations:

In particular, a polishing slurry is obtained, comprising a polishing composition disclosed herein. Obtaining the polishing slurry may include preparing the polishing slurry from the polishing composition via operations such as concentration adjustment (e.g. dilution) and pH adjustment. Alternatively, the polishing composition may be used as is as the polishing slurry. When the polishing composition is separated in multiple formulas, obtaining the polishing slurry may include mixing the formulas, diluting one or more formulas before mixing them, and diluting the mixture after mixing them.

Subsequently, the polishing slurry is supplied to a super-hard surface being the object to be polished and polishing is carried out by a typical method. For instance, an object to be polished is set in a general polishing machine and the polishing slurry is supplied via a polishing pad in the polishing machine to the super-hard surface of the object (to the surface to be polished). In typical, while the polishing slurry is continuously supplied, the polishing pad is pushed against the super-hard surface of the object, and the two are moved (e.g. rotated) in coordination. Via such a polishing step, polishing of the object is completed.

The present description provides a method for polishing a material having a Vickers hardness of 1500 Hv or higher and a method for producing a polished object using the polishing method. The polishing method is characterized by comprising a step of polishing an object using the polishing composition disclosed herein. The polishing method according to a preferable embodiment includes a step of carrying out preliminary polishing (a preliminary polishing step), and a step of earning out final polishing (a final polishing step). The preliminary polishing step referred to herein is a step where preliminary polishing is performed on an object formed of a material having a Vickers hardness of 1500 Hv or higher at least on the surface (a surface to be polished). In a typical embodiment, the preliminary polishing step is a polishing step that is arranged immediately before the final polishing step. The preliminary polishing step can be a single-stage polishing process or a multi-stage polishing process having two or more stages. Here, the final polishing step is a step where final polishing is performed on the preliminarily polished object, referring to a polishing step that is arranged at last (i.e. on the most downstream side) among polishing steps carried out using abrasive-containing polishing slurries. In such a polishing method comprising a preliminary polishing step and a final polishing step, the polishing composition disclosed herein can be used in the preliminary polishing step, in the final polishing step, or in each of the preliminary polishing step and the final polishing step.

In a preferable embodiment, the polishing composition is used in the preliminary polishing step. In the preliminary polishing step, a higher polishing removal rate may be higher than that of the final polishing step. Thus, the polishing (imposition disclosed herein is suitable as the polishing composition (preliminary polishing composition) used in a preliminary polishing step for a super-hard surface. When the preliminary polishing step includes a multi-stage polishing process that includes two or more stages, the polishing composition disclosed herein can be preferably applied to the preliminary polishing in an early stage (on the upstream side). In particular, it can be preferably used in the first preliminary polishing step (typically the initial polishing step) after the lapping step described later.

When the preliminary polishing step includes a multi-stage polishing process that includes two or more stages, two or more stages of the polishing process can be carried out using a polishing composition disclosed herein. In such a case, it is preferable to select the polishing impositions used in the respective stages of the polishing process so that the oxidation-reduction potential (vs. standard hydrogen electrode) of the polishing composition used on the downstream side of the preliminary polishing is lower than the oxidation-reduction potential (vs. standard hydrogen electrode) of the polishing composition used on the upstream side of the preliminary polishing. According to such a combination of polishing compositions, in preliminary polishing of a super-hard material, the polished surface tends to be made smoother in a short time.

When the polishing composition disclosed herein is used in both the preliminary polishing step and the final polishing step, it is preferable to select the preliminary polishing composition and the polishing composition (final polishing composition) used in the final polishing step so that the difference between the oxidation-reduction potential $ORP_{FIN}$ (mV) of the final polishing composition and $ORP_y$ (mV) ($ORP_{FIN}-ORP_y$) is less than the difference between the oxidation-reduction potential $ORP_{PRE}$ (mV) of the preliminary polishing composition and $ORP_y$ (mV) ($ORP_{PRE}-ORP_y$). According to such a combination of the preliminary polishing composition and the final polishing composition, the polished lace tends to be made desirably smooth in a short time in polishing of a super-hard material.

The polishing method disclosed herein can be preferably practiced in an embodiment comprising a step of earning out preliminary polishing of an object using a preliminary polishing composition having an oxidation-reduction potential $ORP_{PRE}$ (mV) that satisfies $ORP_{PRE}-ORP_y \geq 100$ mV; and a step of carrying out final polishing of the object using a final polishing composition having tin oxidation-reduction potential $ORP_{FIN}$ (mV) that satisfies $ORP_{FIN}-ORP_y \leq 100$ mV, the method comprising these steps in this order. According to such a combination of the preliminary polishing composition and the final polishing composition, the polished face tends to be made smoother in a shorter time in polishing of a super-hard material.

In a preferable final polishing composition, $ORP_{FIN}-ORP_y$ is 50 mV or less. The use of the final polishing composition having a relatively small $ORP_{FIN}-ORP_y$ value, smoothness and flatness can be combined at a high level on a super-hard surface. From the standpoint, of the polishing efficiency etc., the $ORP_{FIN}-ORP_y$ value is preferably $-500$ mV or greater, or more preferably $-200$ mV or greater. For instance, with the combined use of the final polishing composition that satisfies $-200$ mV $\leq ORP_{FIN}-ORP_y \leq 0$ mV and the preliminary polishing composition that satisfies ($ORP_{PRE}-ORP_y \geq 100$ mV a polished object having a smooth and flat super-hard surface can be efficiently obtained. The oxidation-reduction potential $ORP_{FIN}$ of the final polishing composition can be, but is not particularly limited to, for instance, 300 mV to 750 mV (preferably 400 mV to 700 mV).

The preliminary polishing and the final polishing can be applied to polishing either with a single-side polishing machine or with a double-side polishing machine. With respect to the single-side polishing machine, the object to be polished is adhered to a ceramic plate with wax or held with a holder called a carrier; while supplying the polishing composition, a polishing pad is pushed against one face of the object and the two are moved (e.g. rotated) in coordination to polish the one face of the object. With respect to the double-side polishing machine, the object to be polished is held with a holder called a earner; while supplying the polishing composition from the top, the surface plates are pushed against the opposing laces of the object and they are rotated in opposite directions to simultaneously polish the two faces of the object.

The polishing pads used in the respective polishing steps disclosed herein are not particularly limited. For instance, any species can be used among non-woven fabric types, suede types, hard polyurethane foam types, abrasive-containing species, abrasive-free species, etc.

The object polished by the method disclosed herein is typically cleaned after polished. The cleaning can be carried out using a suitable detergent. The detergent used is not particularly limited. A suitable species can be selected and used among detergents that are commonly known or used.

The polishing method disclosed herein may include an optional step in addition to the preliminary polishing step and the final polishing step. Such a step can be a lapping step carried out before the preliminary polishing step. In the lapping step, the surface of a platen (e.g. a cast iron platen) for polishing is pushed against the object to be polished to carry out polishing of the object. Thus, polishing pads are not used in the lapping step. The lapping step is typically carried out with an abrasive (typically a diamond abrasive) supplied between the platen for polishing and the object to be polished. The polishing method disclosed herein may include an additional step (a cleaning step or a polishing step) before the preliminary polishing step, or between the preliminary polishing step and the final polishing step.

<Method for Producing Polished Objects>

Matters provided by the art disclosed herein may include, for instance, a method for producing a polished object (e.g. a substrate). In other words, the art disclosed herein provides a method for producing a polished object, the method comprising polishing an object formed of a material having a Vickers hardness of 1500 Hv or higher at least on the surface with a polishing composition disclosed herein supplied to the object. The production method can be practiced by preferably applying the features of a polishing method disclosed herein. The production method can efficiently provide a polished object (e.g. a substrate) having a super-hard surface.

Several working examples related to the present invention are described below, but the present invention is not limited to these examples. In the description below, "%" is by weight unless otherwise informed.

<Preparation of Polishing Compositions>

Example 1

Were mixed alumina (500 nm in mean secondary particle diameter) as the abrasive, potassium permanganate ($KMnO_4$) as the polishing aid, and deionized water to prepare a polishing composition. In the polishing composition, the abrasive content (W) was 6% and the $KMnO_4$ content (C) was 1.2%. The pH of the polishing composition was adjusted to 9.0 using KOH.

Example 2

In place of $KMnO_4$, sodium periodate ($NaIO_4$) was used. The $NaIO_4$ content of the polishing composition was 1.2%. Otherwise in the same manner as Example 1, a polishing composition was prepared.

Example 3

The abrasive content was 2%. Otherwise in the same manner as Example 1, a polishing composition was prepared.

Comparative Example 1

In place of $KMnO_4$, sodium vanadate ($NaVO_3$) and hydrogen peroxide ($H_2O_2$) were used. In the polishing composition, the $NaVO_3$ content was 1.9% and the $H_2O_2$ content was 1.2%. Otherwise in the same manner as Example 1, a polishing composition was prepared.

Comparative Example 2

In place of $KMnO_4$, hydrogen peroxide ($H_2O_2$) was used. In the polishing composition, the $H_2O_2$ content was 1.2%. Otherwise in the same manner as Example 1, a polishing composition was prepared.

Comparative Example 3

In place of $KMnO_4$, sodium tungstate ($Na_2WO_4$) and hydrogen peroxide ($H_2O_2$) were used. In the polishing composition, the $Na_2WO_4$ content was 1.9% and the $H_2O_2$ content was 1.2%. Otherwise in the same manner as Example 1, a polishing composition was prepared.

(Determination of Oxidation-Reduction Potential)

The oxidation-reduction potentials $ORP_x$ vs. standard hydrogen electrode of the polishing compositions of the respective examples were determined at a liquid temperature of 25° C., using an oxidation-reduction potentiometer (meter model: F-52, electrode model: 9300) available from Horiba, Ltd. In addition, the oxidation-reduction potential $ORP_y$ vs. standard hydrogen electrode was determined for SiC (the material polished). In particular, SiC powder was dispersed in water to prepare a slurry; the slurry was adjusted with KOH to the same pH (=9.0) as the polishing compositions; and using the oxidation-reduction potentiometer, the oxidation-reduction potential of the slurry was measured and the value was recorded as the oxidation-reduction potential $ORP_y$ of SiC. SiC had an oxidation-reduction potential $ORP_y$ of 607 mV From the resulting values and the compositions of the polishing compositions according to the respective examples, the values of $ORP_x - ORP_y$, W/C and α (i.e. $(ORP_x - ORP_y) \times W$) were determined.

<Evaluation of Polishing Removal Rates>

Using the polishing compositions obtained and a diamond abrasive having a mean particle diameter of 5 μm, surfaces of pre-lapped SiC wafers were subjected to polishing under the conditions shown below. According to the equations (1) and (2) shown below, the polishing removal rates were determined. The results are shown in the corresponding columns in Table 1.

Polishing removal (cm)=difference in weight of SiC wafer after polished (g)÷density of SiC (g/cm$^3$) (=3.21 g/cm$^3$)÷area polished (cm$^2$)(=19.62 cm$^2$)  (1)

Polishing removal rate (nm/h)=polishing removal (cm)×10$^7$÷polishing time (=1h)  (2)

[Polishing Conditions]

Polishing machine: single-face polishing machine, model EJ-380IN, available from Engis Japan Corporation Polishing pad: trade name SUBA800 available from Nitta Haas Inc.

Polishing pressure: 300 g/cm$^2$

Platen rotational speed: 80 rpm

Polishing time: 1 hour (h)

Head rotational speed: 40 rpm

Flow rate of polishing slurry: 20 mL/min (flow-through)

Temperature of polishing slurry: 25° C.

Polished object: SiC water (n-type conduction, crystal type: 4H 4° off) 2 inches

TABLE 1

| | Polishing composition | | | | | | | Polishing removal rate (nm/h) |
|---|---|---|---|---|---|---|---|---|
| | Abrasive | | Polishing aid | | | | | |
| | Species | W (%) | Species | C (%) | $ORP_x$ (mV) | $ORP_x$-$ORP_y$ (mV) | W/C | α | |
| Ex. 1 | Alumina | 6 | $KMnO_4$ | 1.2 | 915 | 308 | 5 | 1848 | 800 |
| Ex. 2 | Alumina | 6 | $NaIO_4$ | 1.2 | 820 | 213 | 1278 | 444 | |
| Ex. 3 | Alumina | 2 | $KMnO_4$ | 1.2 | 1025 | 418 | 17 | 836 | 380 |
| Comp. Ex. 1 | Alumina | 6 | $NaVO_3$/$H_2O_2$ | 1.9/1.2 | 657 | 50 | 1.9 | 300 | 288 |
| Comp. Ex. 2 | Alumina | 6 | $H_2O_2$ | 1.2 | 472 | -135 | 5 | -810 | 218 |
| Comp. Ex. 3 | Alumina | 6 | $Na_2WO_4$/$H_2O_2$ | 1.9/1.2 | 341 | -266 | 1.9 | -1596 | 140 |

As shown in Table 1, with the polishing compositions of Examples 1 to 3 with $ORP_x$-$ORP_y \geq 100$ mV, the polishing removal rate significantly increased as compared to the polishing compositions of Comparative Examples 1 to 3. These results indicate that polishing removal rates can increase when the oxidation-reduction potential $ORP_x$ of the polishing composition is higher by 100 mV or more than the oxidation-reduction potential $ORP_y$ of the material to be polished. With respect to the polishing compositions of Examples 1 and 2, even higher polishing removal rates were obtained as compared to that of Example 3.

Although specific embodiments of the present invention have been described in detail above, these are merely for illustrations and do not limit the scope of claims. The art according to the claims includes various modifications and changes made to the specific embodiments illustrated above.

INDUSTRIAL APPLICABILITY

The present invention can provide a polishing (imposition capable of increasing polishing removal rates.

The invention claimed is:

1. A polishing composition for polishing a material having a Vickers hardness of 1500 Hv or higher, wherein
the polishing composition has an oxidation-reduction potential $ORP_x$ mV, wherein the oxidation-reduction potential $ORP_x$ of the polishing composition is in a range of 750 mV to 1500 mV, and
the polishing composition comprises an abrasive and a polishing aid, wherein
the abrasive comprises at least one species selected from the group consisting of silica particles, alumina particles, cerium oxide particles, chromium oxide particles, titanium dioxide particles, zirconium oxide particles, magnesium oxide particles, zinc oxide particles, iron oxide particles, nitride particles, carbide particles, diamond particles, carbonates, organic particles, and inorganic/organic composite particles, the abrasive has a mean secondary particle diameter of 400 nm or larger and 800 nm or smaller, and
the polishing aid comprises at least one species selected from the group consisting of nitric acid compounds, persulfuric acid compounds, chloric acid, salts of chloric acid, perchloric acid, salts of perchloric acid, bromic acid, salts of bromic acid, iodic acid, salts of iodic acid, periodic acid, salts of periodic acid, ferrates, permanganates, chromates, ruthenates, molybdates and rhenates.

2. The polishing composition according to claim 1, wherein the polishing composition has an abrasive content W % by weight and a polishing aid content C % by weight, and their relation satisfying the following formula (2):

$$W/C \geq 1.5 \qquad (2).$$

3. The polishing composition according to claim 2, wherein the abrasive content W is 4% to 10% by weight.

4. The polishing composition according to claim 1, having a pH in a range of 8 to 11.

5. The polishing composition according to claim 1, wherein the polishing aid is a composite metal oxide, wherein the composite metal oxide is at least one selected from the group consisting of metal nitrates, ferrates, permanganates, chromates, vanadates, ruthenates, molybdates, rhenates and tungstates.

6. A polishing composition for polishing a material having a Vickers hardness of 1500 Hv or higher, wherein
the polishing composition has an oxidation-reduction potential $ORP_x$ mV, satisfying the following formula:

$$ORP_x \geq 707 \text{mV},$$

the polishing composition comprises an abrasive and a polishing aid,
the abrasive comprises at least one species selected from the group consisting of silica particles, alumina particles, cerium oxide particles, chromium oxide particles, titanium dioxide particles, zirconium oxide particles, magnesium oxide particles, zinc oxide particles, iron oxide particles, nitride particles, carbide particles, diamond particles, carbonates, organic particles, and inorganic/organic composite particles, and
the polishing composition has a pH in a range of 8 to 11.

7. The polishing composition according to claim 6, wherein the oxidation-reduction potential $ORP_x$ of the polishing composition is in a range of 750 mV to 1500 mV.

8. The polishing composition according to claim 6, wherein the abrasive content W is 4% to 10% by weight.

9. The polishing composition according to claim 6, wherein the polishing aid is a composite metal oxide.

10. The polishing composition according to claim 6, wherein the polishing aid comprises at least one species selected from the group consisting of nitric acid compounds, persulfuric acid compounds, chloric acid, salts of chloric acid, perchloric acid, salts of perchloric acid, bromic acid, salts of bromic acid, iodic acid, salts of iodic acid, periodic acid, salts of periodic acid, ferrates, permanganates, chromates, ruthenates, molybdates and rhenates.

11. A polishing composition for polishing a material having a Vickers hardness of 1500 Hv or higher,
wherein
the polishing composition has an oxidation-reduction potential $ORP_x$ in a range of 750 mV to 1500 mV,
the polishing composition comprises an abrasive and a polishing aid, and
the abrasive consists of alumina particles having a mean secondary particle diameter of 400 nm or larger and 800 nm or smaller.

12. The polishing composition according to claim 11, wherein the abrasive content W is 4% to 10% by weight.

13. The polishing composition according to claim 11, having a pH in a range of 8 to 11.

14. The polishing composition according to claim 11, wherein the polishing aid is a composite metal oxide.

15. The polishing composition according to claim 11, wherein the polishing aid comprises at least one species selected from the group consisting of nitric acid compounds, persulfuric acid compounds, chloric acid, salts of chloric acid, perchloric acid, salts of perchloric acid, bromic acid, salts of bromic acid, iodic acid, salts of iodic acid, periodic acid, salts of periodic acid, ferrates, permanganates, chromates, ruthenates, molybdates and rhenates.

16. The polishing composition according to claim 11, wherein the polishing aid comprises at least one species selected from the group consisting of nitric acid compounds, persulfuric acid compounds, chloric acid, salts of chloric acid, perchloric acid, salts of perchloric acid, bromic acid, salts of bromic acid, iodic acid, salts of iodic acid, periodic acid, salts of periodic acid, ferrates, permanganates, chromates, ruthenates, molybdates and rhenates, and
the polishing composition has a pH in a range of 8 to 11.

17. The polishing composition according to claim 1, wherein the polishing aid is at least one selected from the group consisting of ferrates, permanganates, chromates, ruthenates, molybdates, and rhenates.

* * * * *